(12) United States Patent
Husher

(10) Patent No.: US 6,894,393 B1
(45) Date of Patent: May 17, 2005

(54) BURIED POWER BUS UTILIZED AS A SINKER FOR HIGH CURRENT, HIGH POWER SEMICONDUCTOR DEVICES AND A METHOD FOR PROVIDING THE SAME

(75) Inventor: John Durbin Husher, Santa Clara, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/034,067

(22) Filed: Dec. 28, 2001

(51) Int. Cl.[7] .............................................. H01L 23/48
(52) U.S. Cl. ...................... 257/773; 257/565; 438/629
(58) Field of Search ................................ 257/565, 773; 438/341, 629

(56) References Cited

U.S. PATENT DOCUMENTS

| | | | |
|---|---|---|---|
| 4,933,743 A | 6/1990 | Thomas et al. ................ 357/71 |
| 5,369,291 A | 11/1994 | Swanson ..................... 257/130 |
| 5,436,190 A | 7/1995 | Yang et al. .................. 438/296 |
| 5,612,567 A | 3/1997 | Baliga ........................ 257/475 |
| 5,614,750 A | * 3/1997 | Ellul et al. .................... 257/386 |
| 5,691,555 A | 11/1997 | Zambrano .................... 257/332 |
| 5,844,273 A | 12/1998 | Konishi ....................... 257/331 |
| 5,894,140 A | 4/1999 | Terasawa .................... 257/147 |
| 5,903,031 A | 5/1999 | Yamada et al. ............. 257/356 |
| 5,929,482 A | 7/1999 | Kawakami et al. ......... 257/328 |
| 6,008,127 A | 12/1999 | Yamada ...................... 438/694 |
| 6,020,600 A | 2/2000 | Miyajima et al. ............. 257/76 |
| 6,359,374 B1 | 3/2002 | Dausch et al. .............. 310/330 |
| 6,369,425 B1 | 4/2002 | Ferla et al. .................. 257/341 |
| 2001/0055861 A1 | 12/2001 | Patti ........................... 438/524 |

* cited by examiner

Primary Examiner—Christian Wilson
(74) Attorney, Agent, or Firm—Sawyer Law Group LLP

(57) ABSTRACT

A method and system for providing a sinker on a semiconductor device is described. The method and system includes providing a substrate region and providing a buried layer and an epitaxial (EPI) layer over the substrate region. The method and system further includes etching a plurality of device structures in the EPI layer and providing a slot in the semiconductor substrate that is in contact with the buried layer and the substrate region. The method and system finally includes oxidizing the slot except at the bottom of the slot and providing metal within the slot.

8 Claims, 19 Drawing Sheets

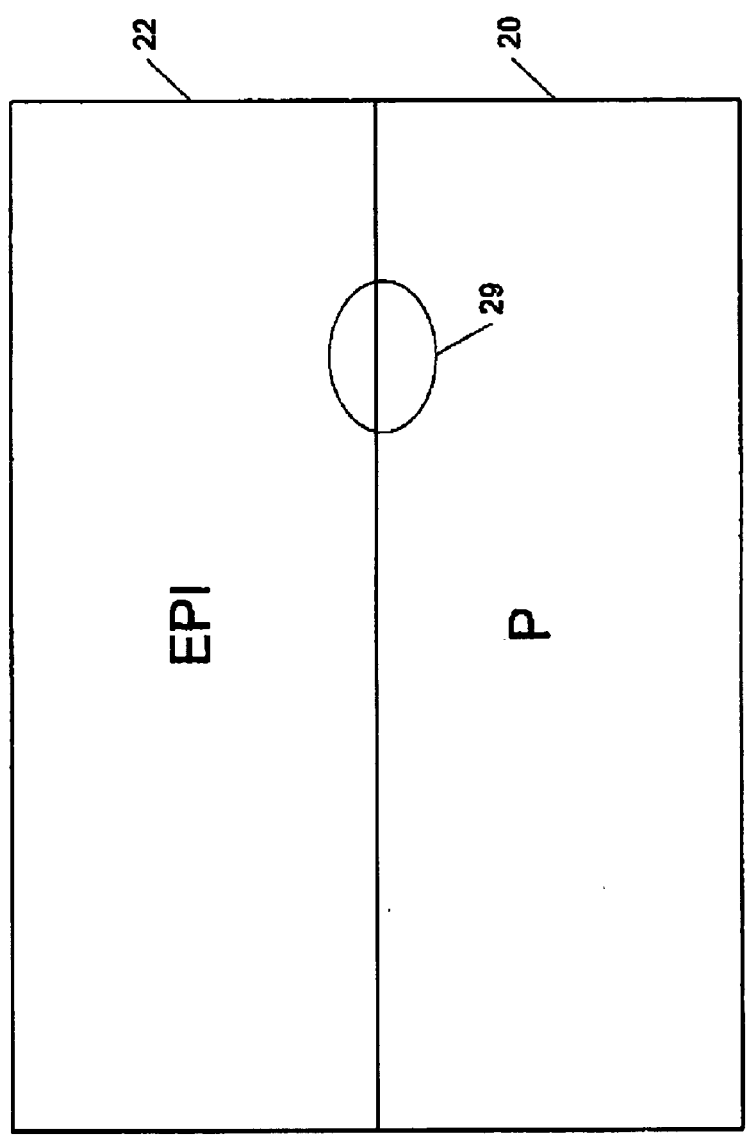

Resist Planar Etched Leaving Resist in Slots. Field Metal Etched Off.

BURIED POWER BUS UTILIZED AS A SINKER FOR HIGH CURRENT, HIGH POWER SEMICONDUCTOR DEVICES AND A METHOD FOR PROVIDING THE SAME

CROSS-RELATED APPLICATIONS

The present application is related to the following listed two application Ser. No. 10/034,184, entitled "Buried Power Buss for High Current, High Power Semiconductor Devices and A Method for Providing the Same;" and Ser. No. 10/034,279, entitled "Buried Power Buss Utilized as a Ground Strap for High Current, High Power Semiconductor Devices and A Method for Providing the Same"; assigned to the assignee of the present application, and filed on the same date.

FIELD OF THE INVENTION

The present invention relates generally to high current, high power devices and more particularly to providing a buried power buss for such devices.

BACKGROUND OF THE INVENTION

Presently there are significant efforts toward improving interconnect methods. The purpose is to provide lower sheet resistance in order to reduce the Ron (on resistance) X Area product of power integrated circuits and to lower the RC time constant of high frequency, wide bandwidth, high pulse rate circuits. One direction has been the use of copper Damascene because of the lower sheet resistivity of copper. For power circuits there has not been much progress other than to thicken and widen the interconnects.

There is a great deal of work being done on the use of a damascene metal scheme, whereby copper is used to provide a low resistance metal interconnect or power bus on a semiconductor device. This approach is being used for high current, high power devices, as well as for high frequency devices to lower their interconnect sheet resistance. The damascene metal scheme has attributes which include the lowering of the resistance of the interconnects, but is solely an interconnect scheme and does not improve the performance of the individual devices. The damascene approach has several disadvantages that are described below.

Firstly, the damascene metal scheme is costly and utilizes copper in place of standard aluminum/silicon/cu interconnects. It is well known that copper is difficult to process. The damascene metal scheme requires specialized equipment for depositing, etching and maintaining the integrity of the interconnect. For example, corrosion easily occurs and requires special equipment and techniques to prevent corrosion which adds time and cost to the product (i.e., dry in, dry out etching is required). In addition this metal then needs to be thickened to lower the sheet resistance.

This is done by a plating process that is expensive. Chemical/mechanical polishing (CMP) is required and is difficult since copper is prone to pitting and other defects, and fills the polishing pad. This scheme also requires that devices related to the CMP polishing be flat, which becomes increasingly difficult as more layers are added. All of these steps require a manufacturer to add equipment that is quite expensive and to develop new techniques using this equipment.

Accordingly, what is needed is a system and method for providing a power buss and interconnect method that overcomes the above-identified problems. The approach and method should be cost effective, easy to implement with existing equipment and processes and provide some technical advantages to devices within the semiconductor as well as providing a low sheet resistance interconnect. The present invention addresses such a need and is referred to as the buried power buss approach.

SUMMARY OF THE INVENTION

A method and system for providing a sinker on a semiconductor device is disclosed.

The method and system comprises providing a substrate region and providing a buried layer and an epitaxial (EPI) layer over the substrate region. The method and system further includes etching a plurality of device structures in the EPI layer and providing a slot in the semiconductor substrate that is in contact with the buried layer and the substrate region. The method and system finally includes oxidizing the slot except at the bottom of the slot and providing metal within the slot.

In a preferred embodiment, the interconnect consists of a combination of a buried power buss and interconnect layer that, when employed properly, provides the following advantages:

1. Slotted metal having an oxide jacket surrounding it, thus allowing the metal to be connected randomly while isolating itself from other circuit functions.

2. Low interconnect sheet resistance available per function performed.

3. Low Ron X Area for a given area, where Ron is the on resistance of a Bipolar Transistor, or an MOS transistor (when used in a CMOS or BiCMOS configuration).

4. Provides an oxide isolated ground strap that is an ideal short to ground.

5. Provides ground strap throughout the integrated circuit wherever isolation is required between components.

6. Provides a metalized sinker for connecting the collector of a BiPolar transistor to the buried layer, or a metalized drain for connecting the drain to the buried layer of a CMOS device; thus ensuring the lowest collector or drain resistance.

7. Provides a metalized sinker and ground strap while eliminating the masking and long time, high temperature isolation diffusion that is in standard processing.

8. Provides a metalized sinker and ground strap while eliminating the masking and long time, high temperature sinker difflusion.

9. When the epitaxial layer is less than 6 microns thick it allows the buried layer masking to be eliminated.

10. Oxide isolation in place of junction isolation results in lower leakage and lower capacitance thus providing a method for improved performance of high frequency, low power devices.

11. Low interconnect sheet resistance that allows for reduced interconnect RC time constants and therefore faster operation.

12. Low interconnect sheet resistance for high current, high power operation of integrated circuits.

13. Significant improvement in heat transfer over standard or damascene methods of metalization and interconnect.

14. Reduced current density in critical parts of the operation of the integrated circuit over standard approaches and other approaches used at this time.

15. Improved electromigration by an order of magnitude due to the improvement in heat transfer and reduced current density.

16. Elimination of isolation and sinker processes in integrated circuits.

17. Significant reduction in the die size for a given function since the isolation and sinker are provided by the buried power buss which is oxide isolated; thus allowing the isolation and sinker to move much closer to other active areas of Bipolar, MOS, DMOS, CMOS and passive components.

18. Significant reduction in de-biasing of emitter, collector, drain in high current applications due to the increase of cross section of metal through the use of this buried power buss. This results not only in a higher gain in these active circuit components, but also wider current range.

19. More gross die per wafer due to the reduction of die size and other savings. Since defect density is a function of area this approach results in less defects due to the reduction in the area of the die and higher yield. This combination of more die per wafer and lower yield loss results in more net die per wafer for a given function when using the buried power buss.

20. Due to improvement in de-biasing, the improvement in heat transfer, and the smaller die; the resulting die is viable in a smaller package and therefore opens up new markets.

21. All these functions and improvements are provided by a single masking process that provides the slots that are oxidized and metalized, while dropping process steps that are numerous, long in process time, and at high temperatures. This results in an integrated circuit process that is very low in Root Dt (square root of the diffusion constant times time). It is a proven fact that processes carried on at lower temperatures reduces the chance for defect introduction and propagation.

22. Due to the improved heat transfer, die using this approach are able to work at higher power dissipation before being limited by secondary breakdown.

23. Due to the thicker metal in the bonding pads there is increased protection against ESD failures as well as providing an improved bonding reliability.

24. The power buss is able to supply thick low sheet resistance metal to both the emitter and collector on Bipolar power devices to prevent de-biasing and provide low Ron resistance of the power output transistor.

BRIEF DESCRIPTION OF THE DRAWINGS

FIG. 2b illustrates a buried layer and an epitaxial (EPI) layer being provided on top of the substrate region.

DETAILED DESCRIPTION

Figure 1:
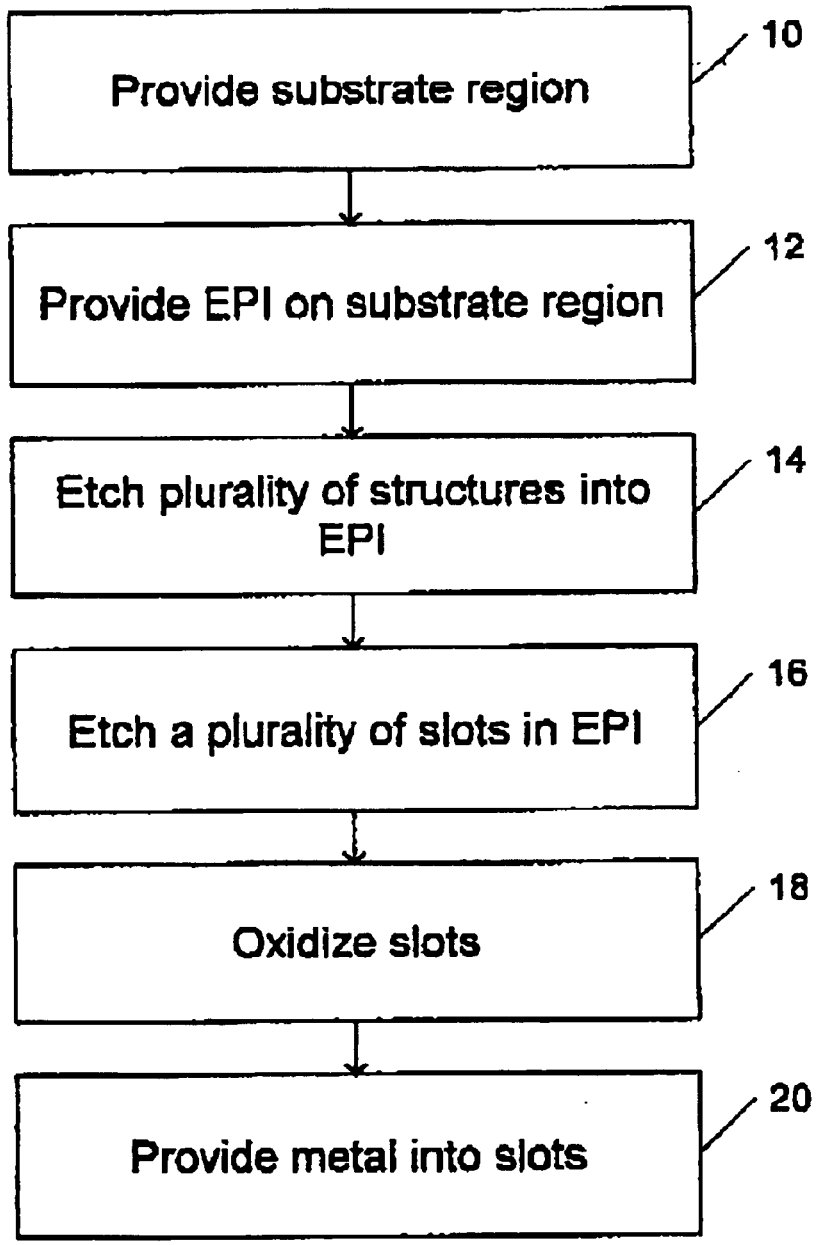
FIG. 1 is a flow chart for providing an interconnect in accordance with the present invention.

The present invention relates generally to high current, high power devices and more particularly to providing a buried power buss for such devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In a method and system accordance with the present invention, an interconnect is provided that has the attributes of being able to provide a thick metal buss while only having to deposit and etch much thinner metal for the interconnect masking. This is accomplished by providing slots, or trenches that are approximately as wide and deep as the thickness of metal one wants in the power carrying metal busses. The thickness comes from folding the metal in the slots when using a CVD deposition metal system, or by multiple, maskless metal depositions when using a conventional metal sputtering system.

Both of these methods of deposition result in metal that is at least double the thickness of the interconnect metal and in most cases is some integer of the interconnect thickness, while only having to etch a thinner metal for the interconnect metal that is outside of the slots. While this is an interconnect approach it provides many other advantages. This approach results in oxide isolation without added steps and allows one to drop the long junction isolation masking and diffusion process. While doing this it provides a direct, oxide isolated, metal strap to ground resulting in a lower resistance to ground than other approaches. This process drops the normal sinker masking and diffusion process while providing an improved sinker without any additional processing.

The method employs slot etching, slot oxidation, and metal deposition within those slots. The slot etching is introduced near the end of a standard process thereby requiring very little change to the standard process while providing numerous advantages. While specifically aimed at its use in high current applications, this approach results in a low sheet resistance metal interconnect approach that is an advantage for use in high frequency, low current applications. This interconnect approach results in a low RC time constant in the metal interconnect between outputs and inputs within the integrated circuit which is required for high speed. This approach also provides for low RC time constant metal interconnects between the output of a circuit and the load. The interconnect is preferably referred to as the buried power buss since it results in a significant portion of the first metal (which typically includes three layers of metal) being buried in the substrate prior to the interconnection masking of the third deposition of metal.

While an interconnect process in accordance with the present invention provides these major advantages for high power devices, its utilization is applicable for small high frequency devices providing low interconnect sheet resistance, a direct short to the substrate for grounding, and a low Ron (on resistance) for both low and high power devices. This approach is applicable to Bipolar, CMOS, BiCMOS, DMOS, and specific devices within these and other technologies.

In addition, the method and system in accordance with the present invention improves the operation of the individual elements within the integrated circuit. Unlike the damsascene scheme which is solely an interconnect method, the interconnects are integrated into other structures in the device to improve the operation of the individual devices and reduce the die size as well as significantly lowering the interconnect sheet resistance. Whereas the damascene method requires added equipment and processes that are very sensitive, as well as expensive, this interconnect approach requires no change in the normal flow of the process up to the interconnect process and requires no added new equipment. It is also easy to handle and to be qualified, since the metal process has proven reliability on integrated circuits over a long period of time.

In a preferred embodiment, the interconnect method occurs at the end of the processing of the active areas. This is true for BiPolar, CMOS, BiCMOS, BCD, Vertical DMOS, and Enhanced Drift Lateral DMOS. This is an advantage since it allows the standard processing to remain intact until the very end of the process.

Buried Power Buss with Accompanying Figures

For a more detailed description of the features of the present invention, refer now to the following description in conjunction with the accompanying figures. FIG. 1 is a simple flow chart for providing a buried power buss or interconnect in accordance with the present invention.

First, a substrate region 20 (FIG. 2a) is provided, via step 10. Next a buried layer is placed into the substrate at a plurality of locations and an epitaxial (EPI) layer 22 (FIG. 2b) is provided, via step 12. Thereafter, a plurality of structures 24 (FIG. 2c) are processed into the EPI layer 22 to provide the semiconductor device, via step 14. Next, a plurality of slots 24 are provided down to the substrate region 20 between structures 24 (FIG. 2d), via step 16. Thereafter, the slots 26 are oxidized 27 (FIG. 2e), via step 19. Finally, metal 28 is provided into the slots to provide the power busses (FIG. 2f), via step 20.

Figure 2A:
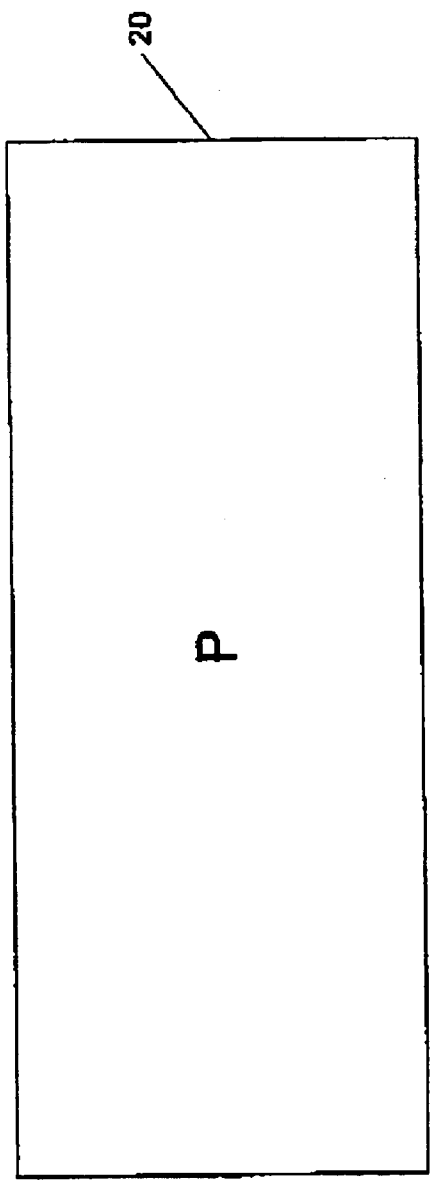
FIG. 2a illustrates a substrate region of a semiconductor device.
Figure 2C:
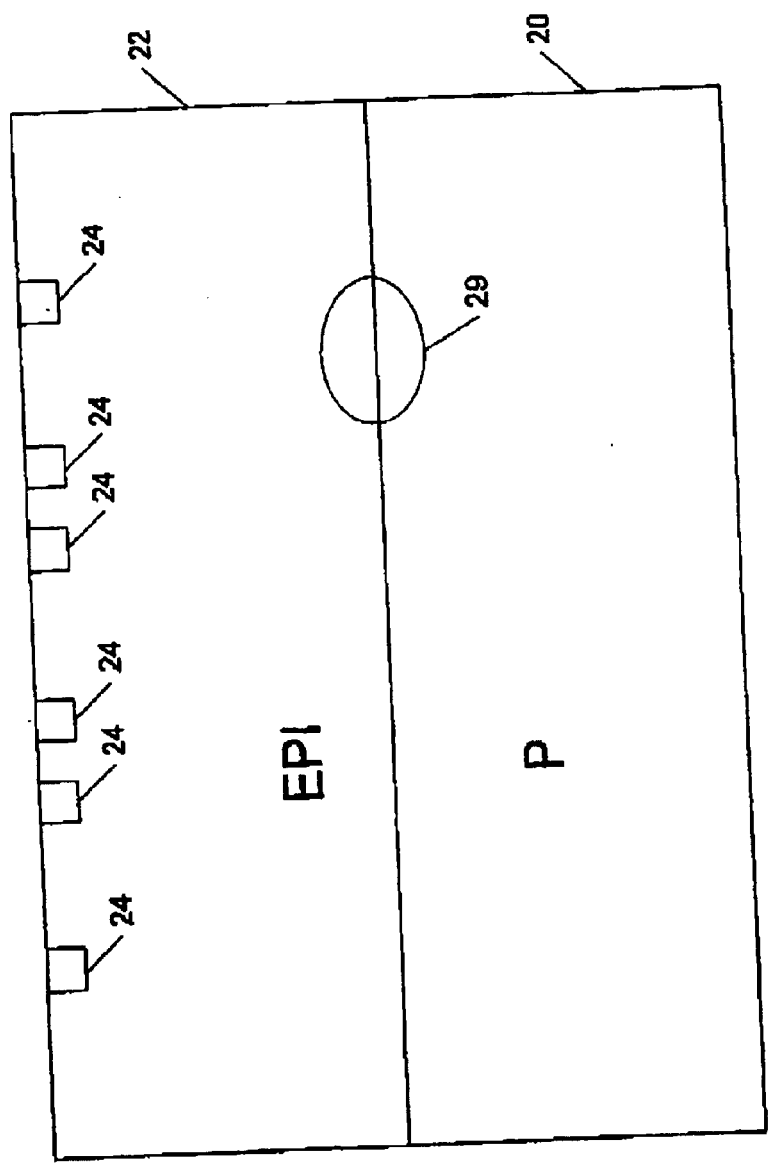
FIG. 2c illustrates a plurality of structures etched into the EPI layer.
Figure 2D:
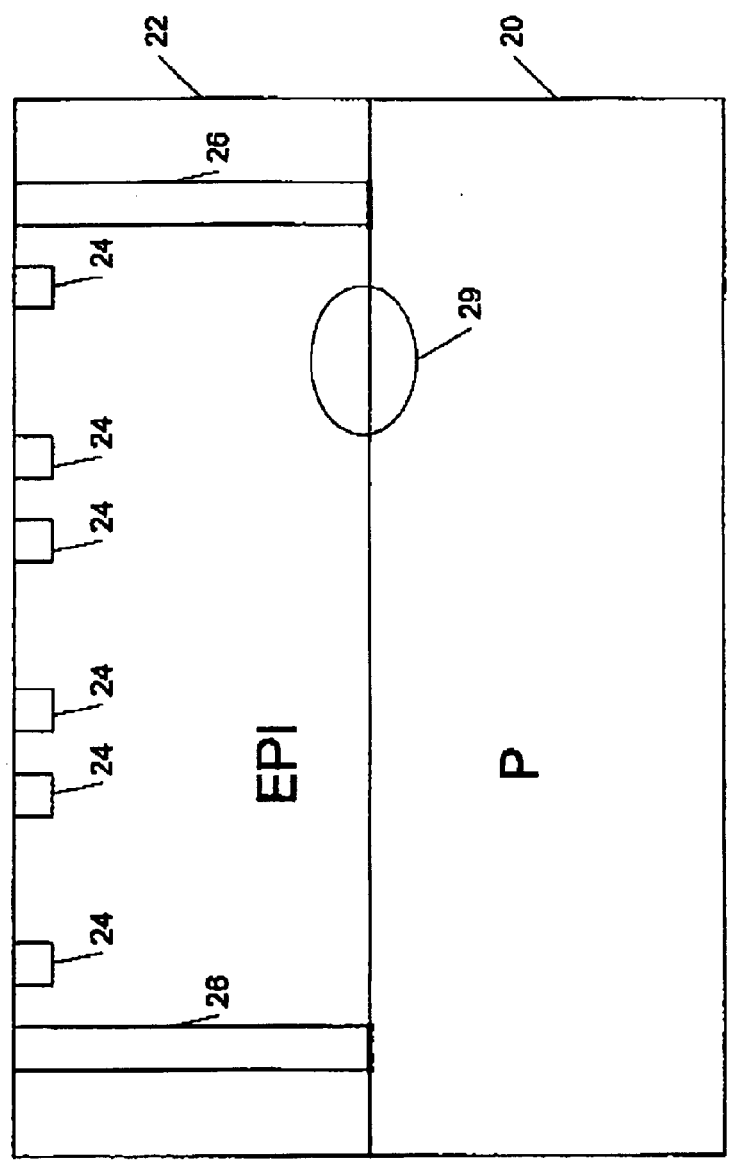
FIG. 2d illustrates a plurality of slots provided down to the substrate between the structures.
Figure 2E:
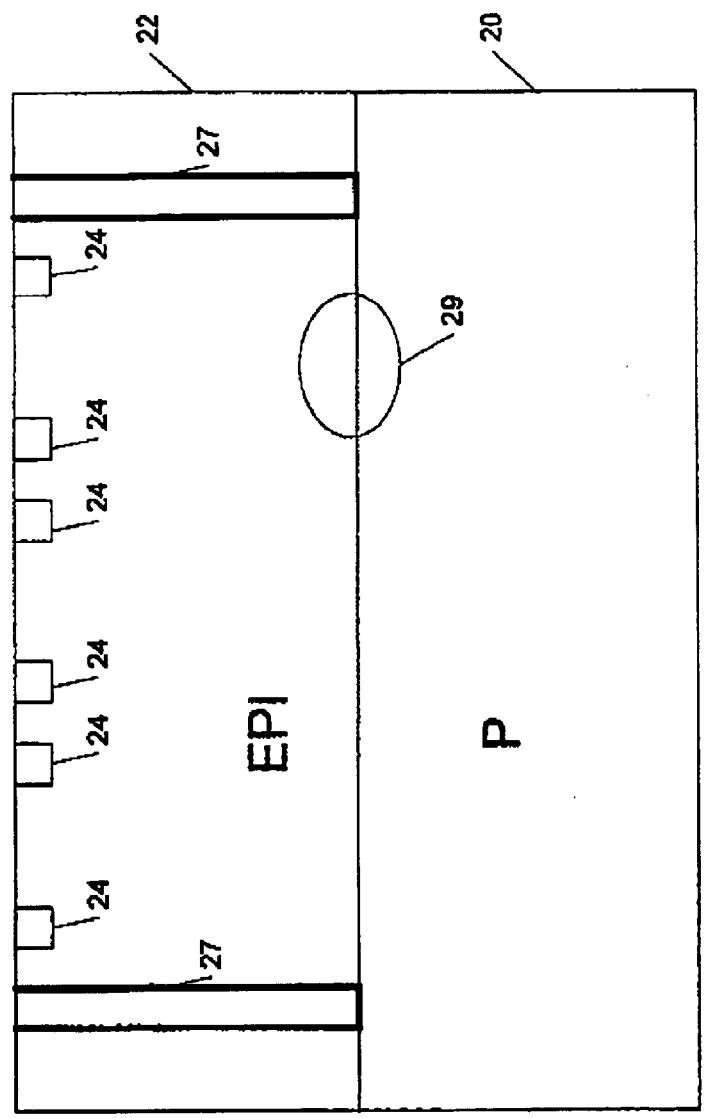
FIG. 2e illustrates the slots being oxidized.
Figure 2F:
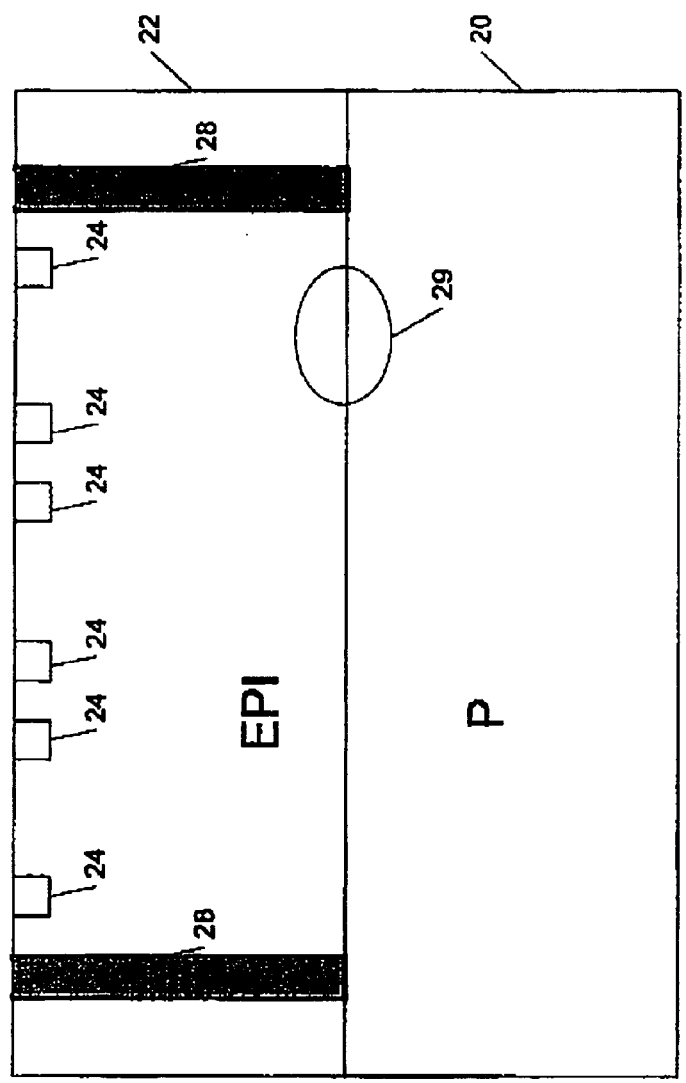
FIG. 2f illustrates metal provided into the slots to provide the power busses.
Figure 2G:
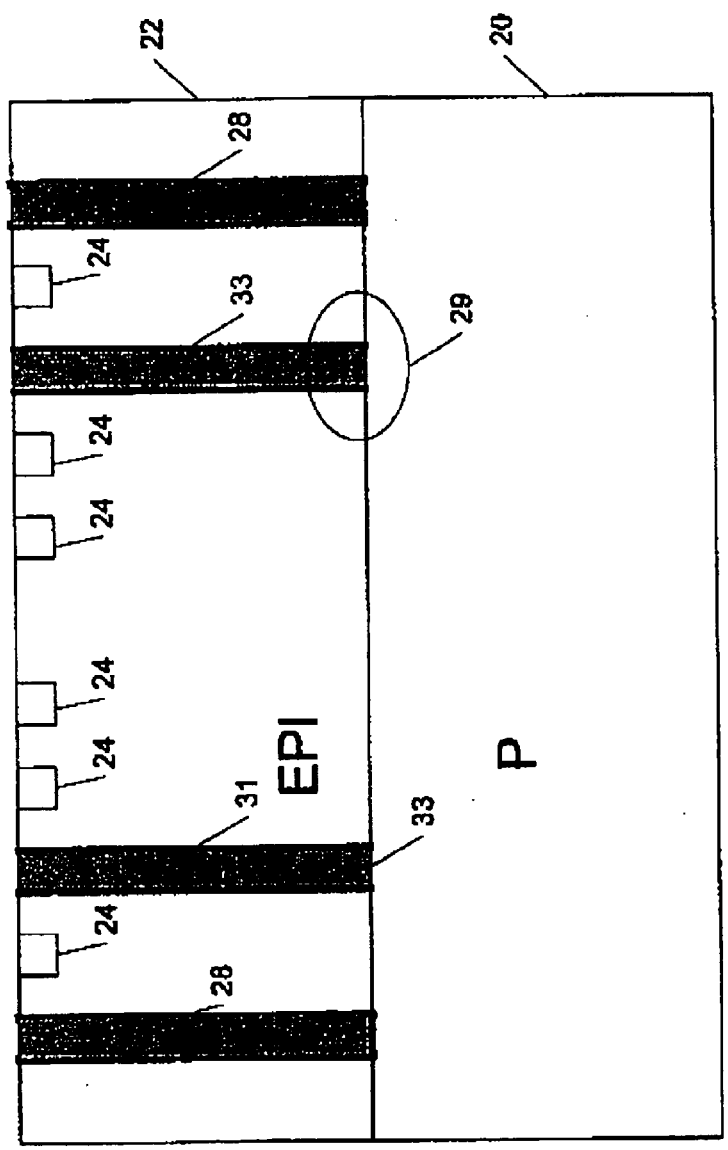
FIG. 2g illustrates oxide being removed from the bottom of a typical slot where metal is to make contact to a grounded substrate or when the metalized slot is to make contact to the buried layer to replace the sinker process.

These slots can also be utilized advantageously to provide a ground or a sinker. In these embodiments the oxide is removed from the bottom of the slots that are going to be used for ground and sinker. FIG. 2a illustrates oxide being removed from the bottom of a slot allowing the metal in the slot to make contact to a buried layer 29 to replace the sinker process.

The ground strap, with the oxide removed from the bottom of the ground slots, makes contact to the substrate. In some cases where good ohmic contact needs to be ensured, boron should be implanted into the ground slots so the metal hits this higher concentration layer. It is less important for the ground than for the sinker. The sinker slot should have N+ implanted into the bottom of the slot prior to oxide being removed to provide a good ohmic contact to the buried layer—unless the buried layer has a high surface concentration making this unnecessary.

Figure 3:
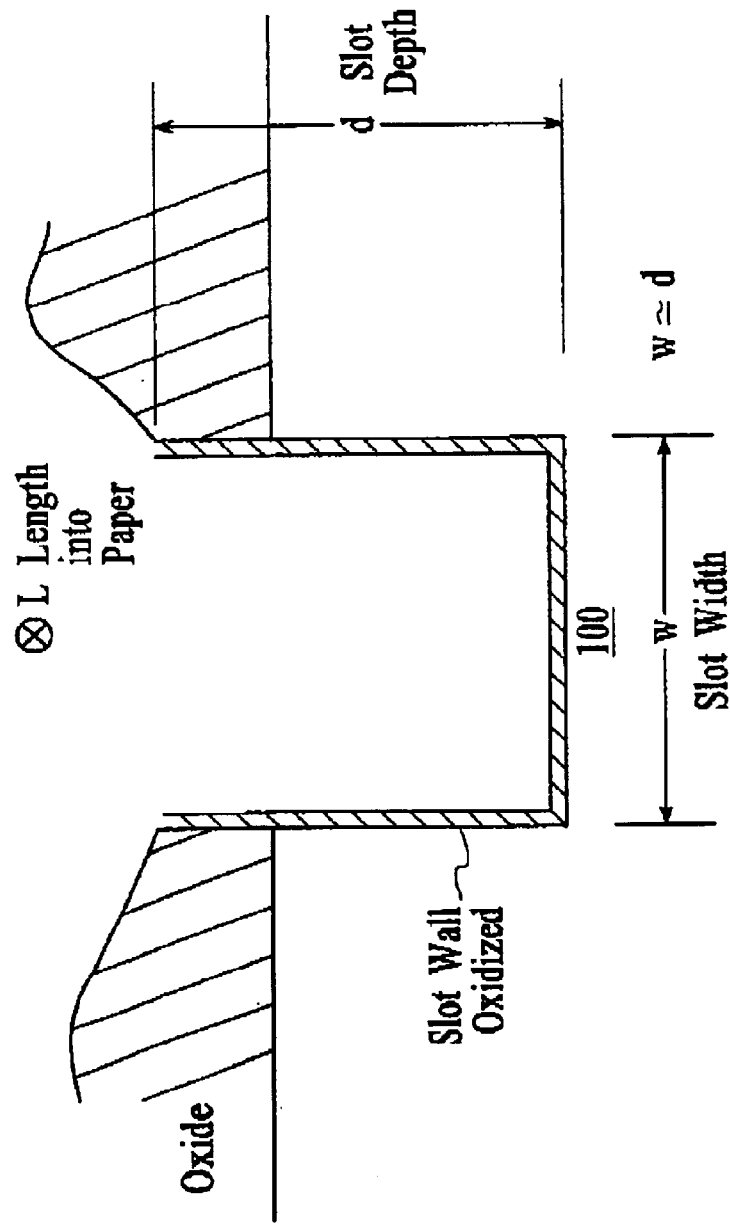
FIG. 3 illustrates a typical oxidized slot with an aspect ratio of one.

FIG. 3 illustrates a typical oxidized slot 100 with an aspect ration of "one" for the depth (d) and width (w). Accordingly, metal can fill the slot depth while obtaining the thickness that is desired for the interconnect metal deposition as supplied by standard processing for the interconnect metal—metal layer in this example.

Methods of Forming an Interconnect

In a preferred embodiment of the present invention, the slots are formed at the end of the semiconductor process and just prior to depositing metal. In this manner a conventional process can be used until the slots are provided. At this point the slots are etched through the dielectrics and into the epitaxial material to meet the outdiffusion of the buried layer for the collector or an up diffusion of a P (Boron) diffusion to make ground contacts. These slots are oxidized and for certain elements the oxide is removed from the bottom of the slots. There are several methods that can be utilized for metal deposition and each of these methods will be discussed herein below.

CVD Metal Deposition

Figure 4:
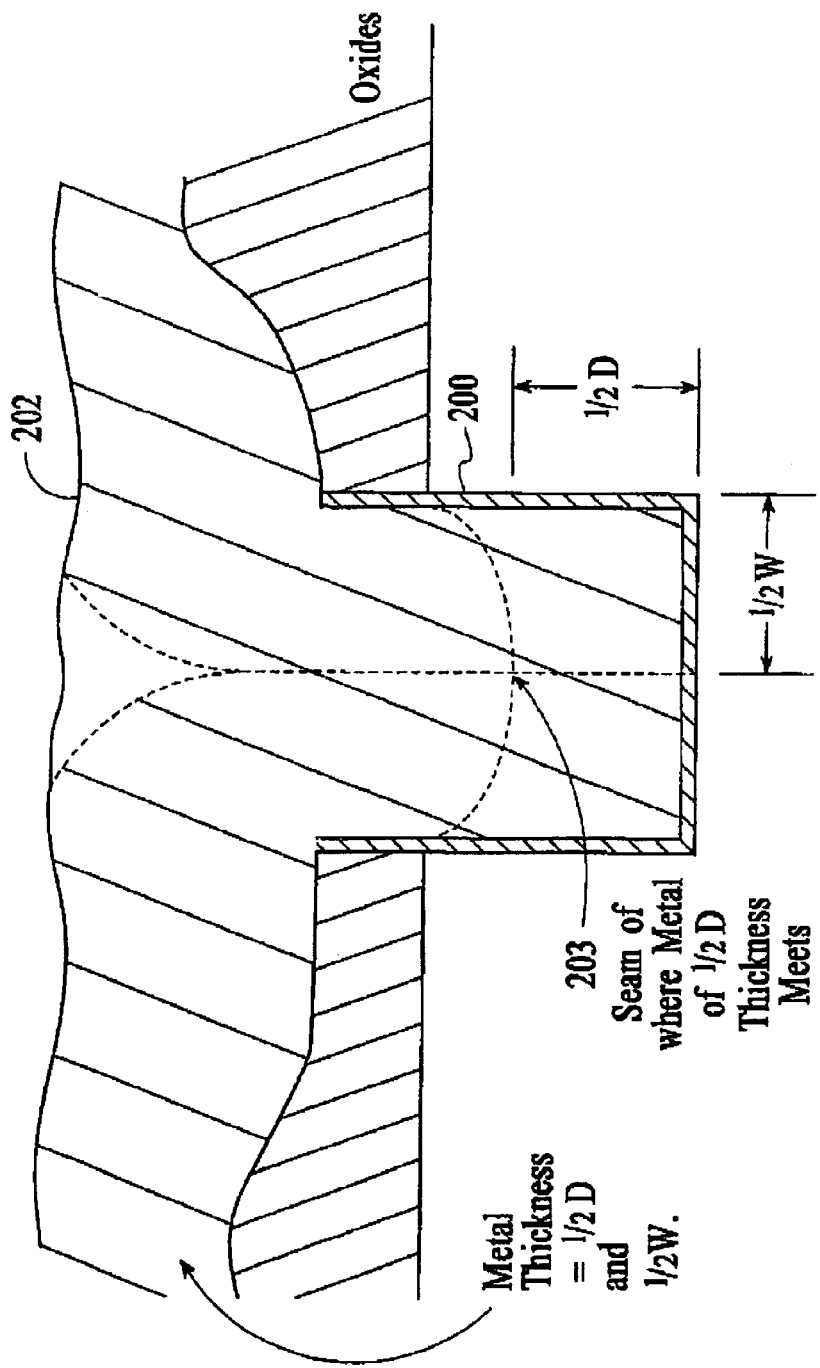
FIG. 4 illustrates a slot that is filled with metal, done with a CVD metal system that provides conformal coating.

FIG. 4 illustrates metal coverage 202 in a slot 200 utilizing CVD metal system to provide a conformed coating. The use of a CVD deposition system results in metal conforming to the shape of the slot. In this case metal is deposited, preferably 2.5 $\mu$m thick or the thickness that one is able to etch conveniently. The metal is 2.5 $\mu$m in the field and 5.0 $\mu$m in the slot due to the "folding" of the metal at a seam 203 in the slot as shown in FIG. 4.

This provides an ideal 5 $\mu$m of metal while only having to etch 2.5 $\mu$M. This would be simple to insert in a conventional semiconductor process and immediately provides a huge advantage in that interconnect resistance is lowered, the electromigration levels would be significantly improved, and heat transfer would be significantly improved. These improvements are gained through the thickness and also because the metal is buried in silicon. Silicon has a heat transfer that is approximately 10 times better than SiO2 (which surrounds standard methods of metal interconnect as well as damascene) and two or three orders of magnitude better than air which surrounds standard oxide covered interconnects and damascene with its low-K dielectric.

In addition, electromigration is improved by at least an order of magnitude due to not only the thickness, but also due to the heat transfer of the silicon in which it is embedded. As will be discussed later, the metal makes contact to the silicon in several areas of the device. In places where it is surrounded by oxide which is then surrounded by silicon, it is several orders of magnitude better than standard interconnects and damascene with their oxide to air transfer. This improved heat transfer results in significant improvement in electromigration, junction breakdown, threshold control, and secondary breakdown as well as the low Ron of the product using this approach. Secondary breakdown is improved since the heating that causes secondary breakdown is reduced through improved heat transfer.

Another major advantage is that the first metal (consisting of two layers to fill the slots and a third layer to provide the interconnects) can carry the power, since it has robust metal busses. Therefore, the classical second metal may not be needed since in many cases second metal is used to carry the heavy current. As is well known, a second metal always increases the Ron of devices due to the added drop of the vias. With the buried power buss approach most of the added functions normally provided by a second metal are provided by the metal in the slots and the interconnect layer provided by the third deposition. Where standard metalization schemes use what is classically called the second metal to provide these functions, second metal may be eliminated, since second metal will no longer be used to carry the supply, ground, or other device high current. The metal is thick in the power buss approach because it is embedded in slots below the surface of the normal interconnect level.

This approach also provides a major advantage in application specific integrated circuits (ASICS), in that the circuits could receive their customizing as the very last layer of metal. The ASIC, for example, using this process can be carried completely through first metal, be tested for certain functions, have the second metal process employed and the wafers kept at a customized inventory position. In this manner, upon receiving an order for the ASIC, only this last metal needs to be patterned thus reducing the turn around time of the product. This is a major advantage. Only prime wafers that have passed wafer sort for parameters will be held in inventory thus limiting the exposure to the possibility that wafers pulled from inventory will fail final test. In addition, where most ASICS have first metal that is 6000A to 8000A, this approach with its 5 $\mu$m of metal allows greater freedom in the selection of the customized layer that will follow.

Figure 4A:
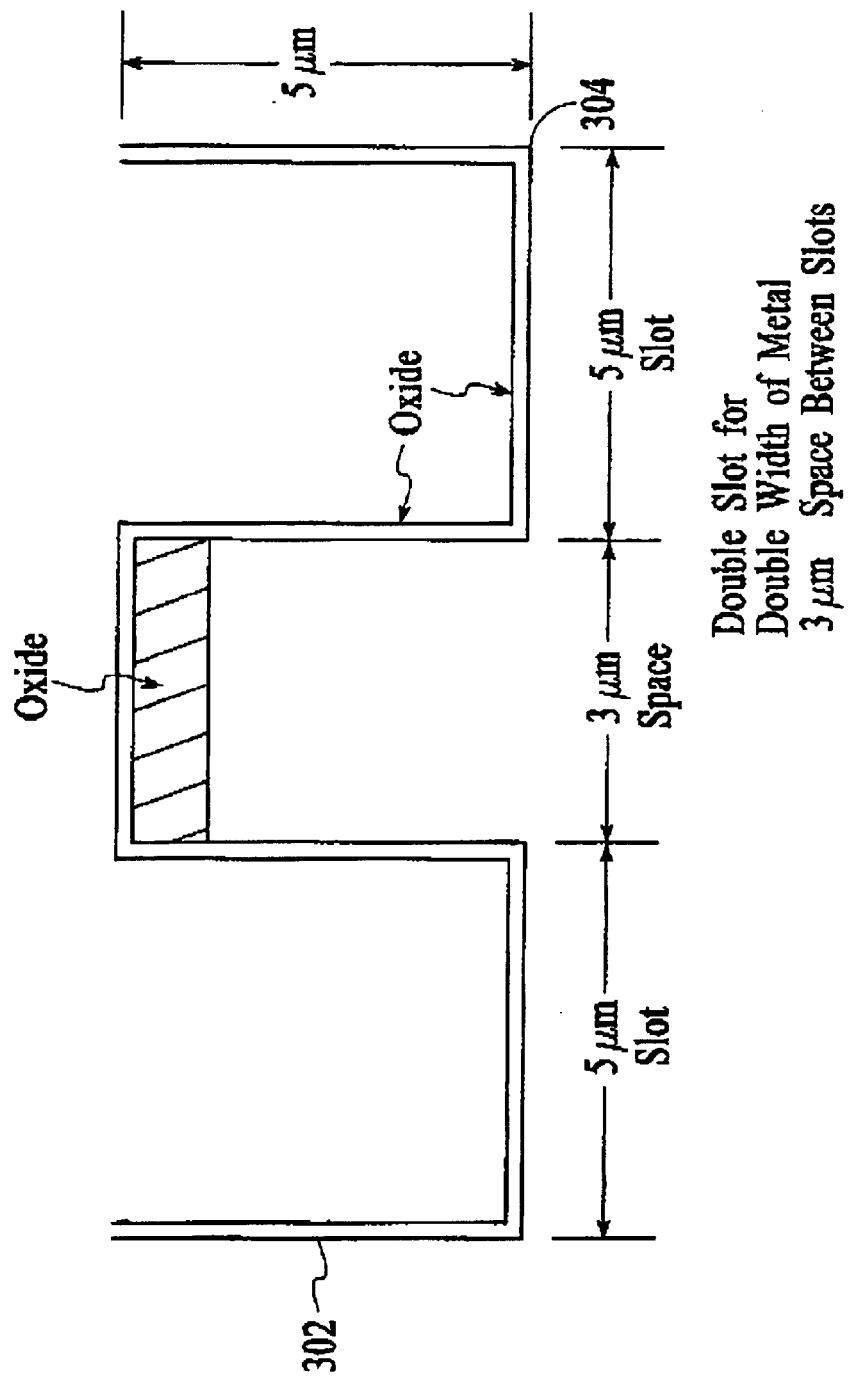
FIG. 4a illustrates a plurality of parallel slots in accordance with the present invention.

Another significant advantage can be gained by adding a second slot or multiple slots parallel to the first as illustrated in FIG. 4A, where preferably there is 3 $\mu$m of spacing between the slots 302 and 304. This will increase the interconnect width to 13 $\mu$m (two slots of 5 $\mu$m and 3 $\mu$m of space between the slots). This example provides a double slot with a cross section of 50 $\mu$m of metal to carry current while only taking up 13 $\mu$m on the surface and requiring etching only 2.5 $\mu$n of metal for the interconnect.

Standard Sputter Deposition for Buried Power Buss

While the method of depositing metal with CVD metal is quite straightforward, some companies do not have CVD metal. This means that standard sputtering equipment is to be used where additional processing is required. Sputter deposition provides some additional advantages over the CVD approach as will be discussed herein below.

Figure 5:
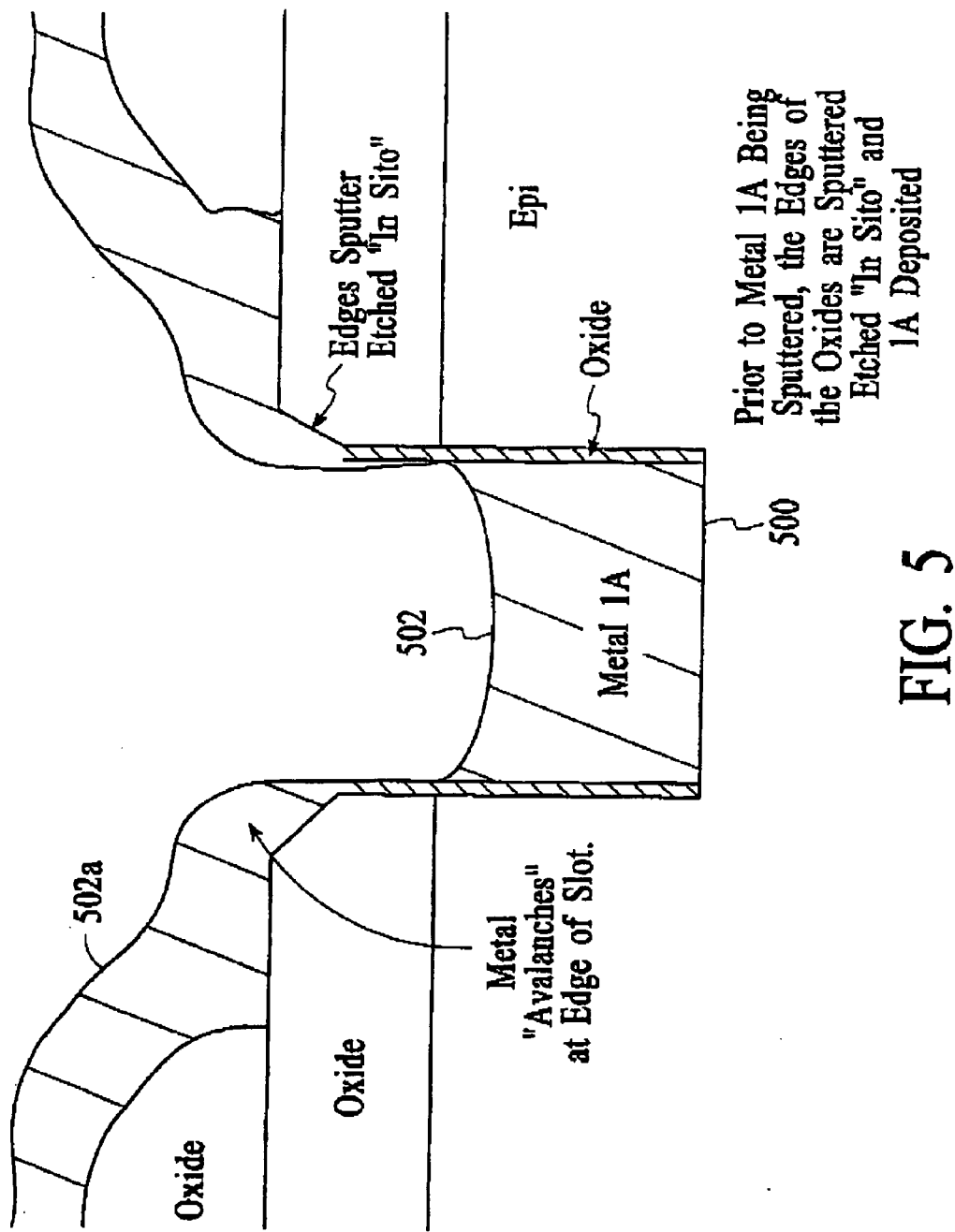
FIG. 5 illustrates the first metal 202 after metal is sputtered into the slot 700 as well as on the surface of the wafer.

FIG. 5 illustrates the sputter deposition after the first metal 502 is provided into the slot 500. As is seen, field metal 502a occurs over the total wafer as well as in the slots. Also, the field metal 502a occurs due to the avalanching of the metal. Due to the large step during the standard sputter deposition, the field metal 502a breaks and leaves the metal somewhat avalanched. The field metal 502a adheres to the side of the slot above the 2.5 $\mu$m level due to metal dropping down from the ledge above. This leaves the field metal somewhat thinner at the edge marked 506 and may even break at this point. The breaking of the metal is expected using the buried power buss and is accommodated as follows. Improved flow into the slots is obtained using heated deposition to increase the metal energy and resultant flow.

Figure 6:
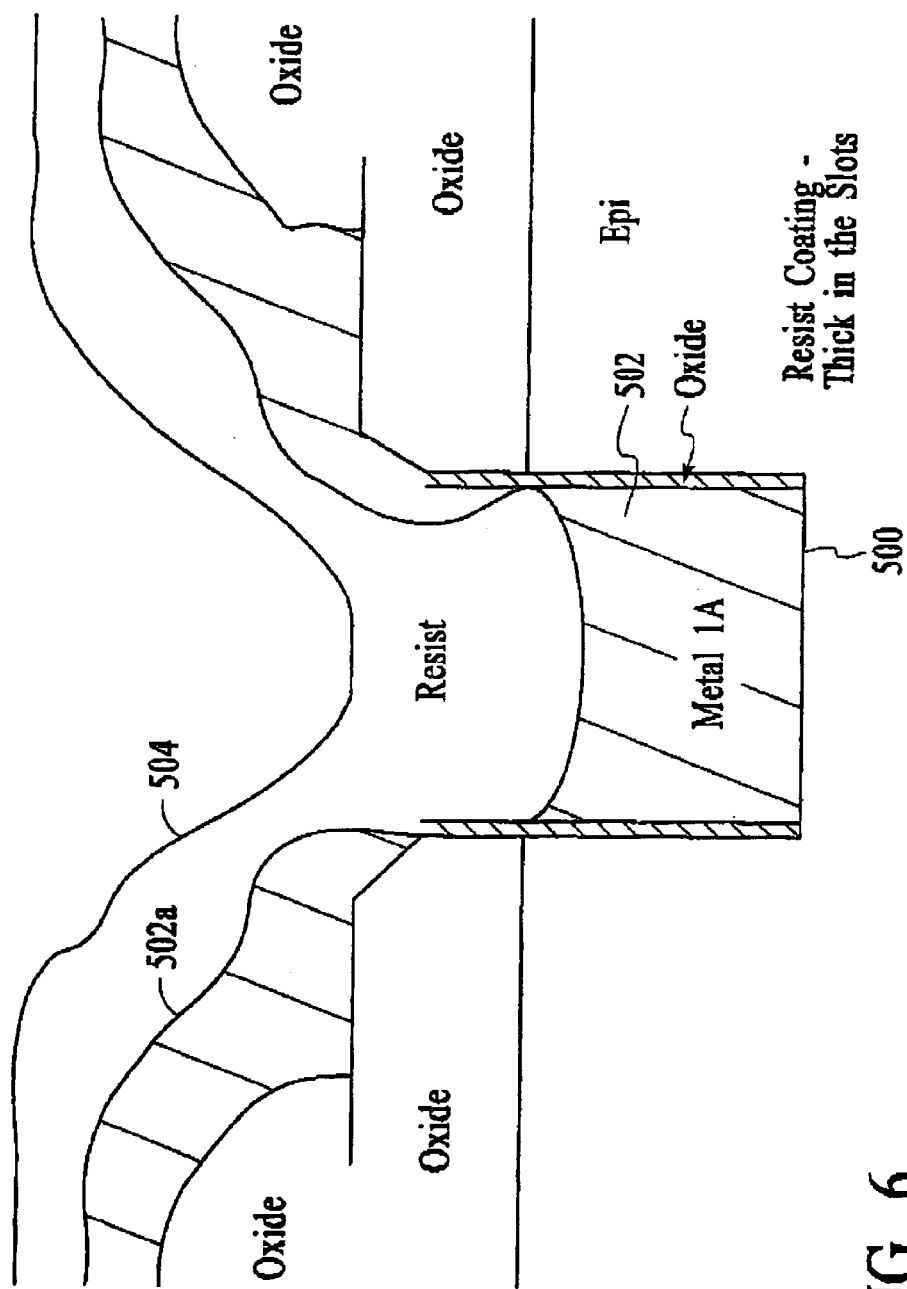
FIG. 6 illustrates a resist coating the wafer over the first metal and resist is thicker in the slot.

FIG. 6 illustrates a resist 504 coating the wafer over the metal 502, wherein resist is thicker in the slot. The field metal 502 is removed using a maskless planarization operation.

Figure 7:
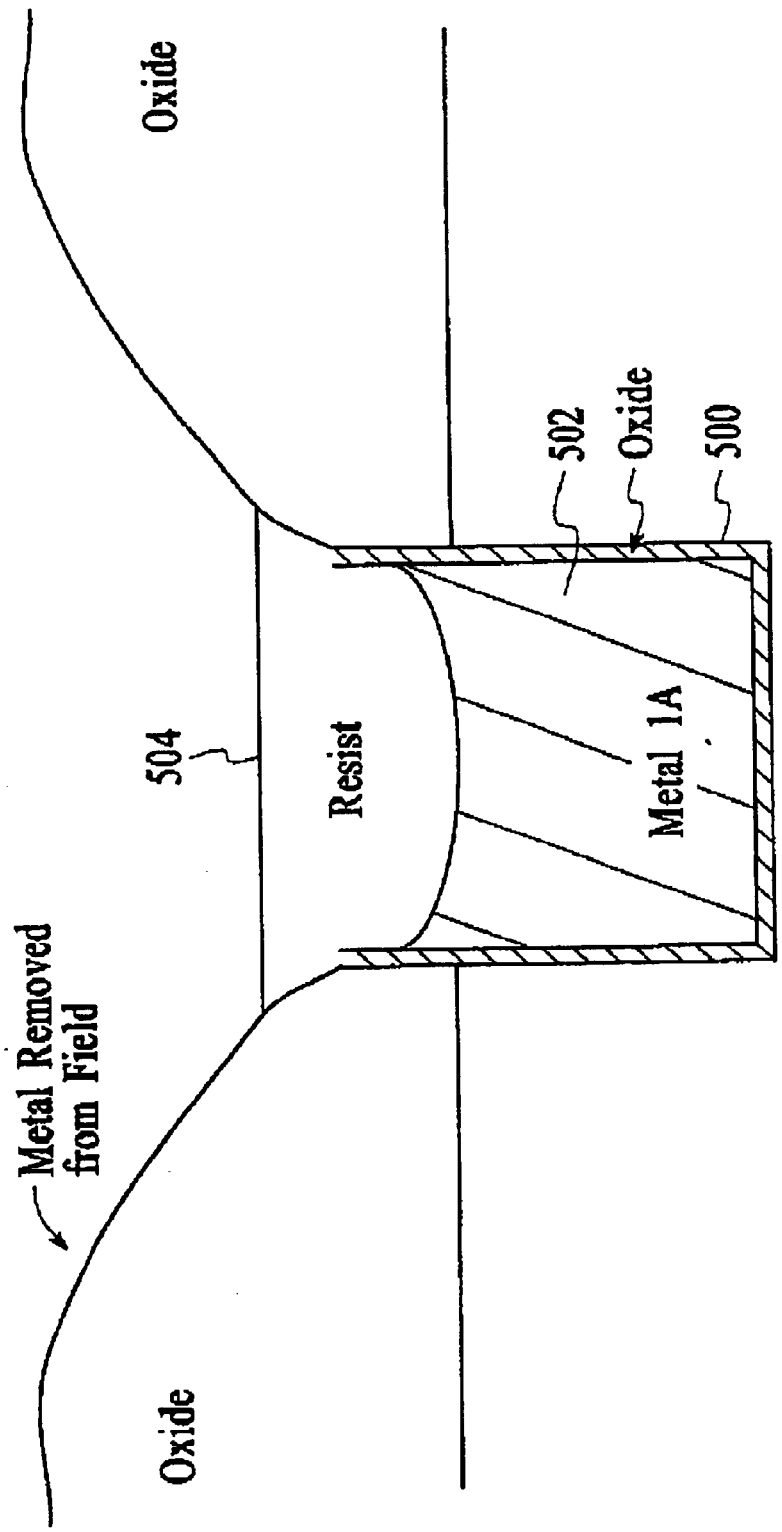
FIG. 7 shows the first metal after planarization etch which removes the resist and metal in the field, leaving resist still in the slots above the first metal. The resist is then stripped.

FIG. 7 illustrates the slot after the field meal is removed. Resist is deposited on the wafers resulting in the field metal being covered and the slots having addition resist due to the flow of the resist seeking the lower level. The wafers are then planarized by dry etching (can be wet dry) which removes the resist and metal in the field on about a one for one basis. This leaves the thicker resist in the slots remaining and the metal below it. Resist is then stripped.

Figure 8:
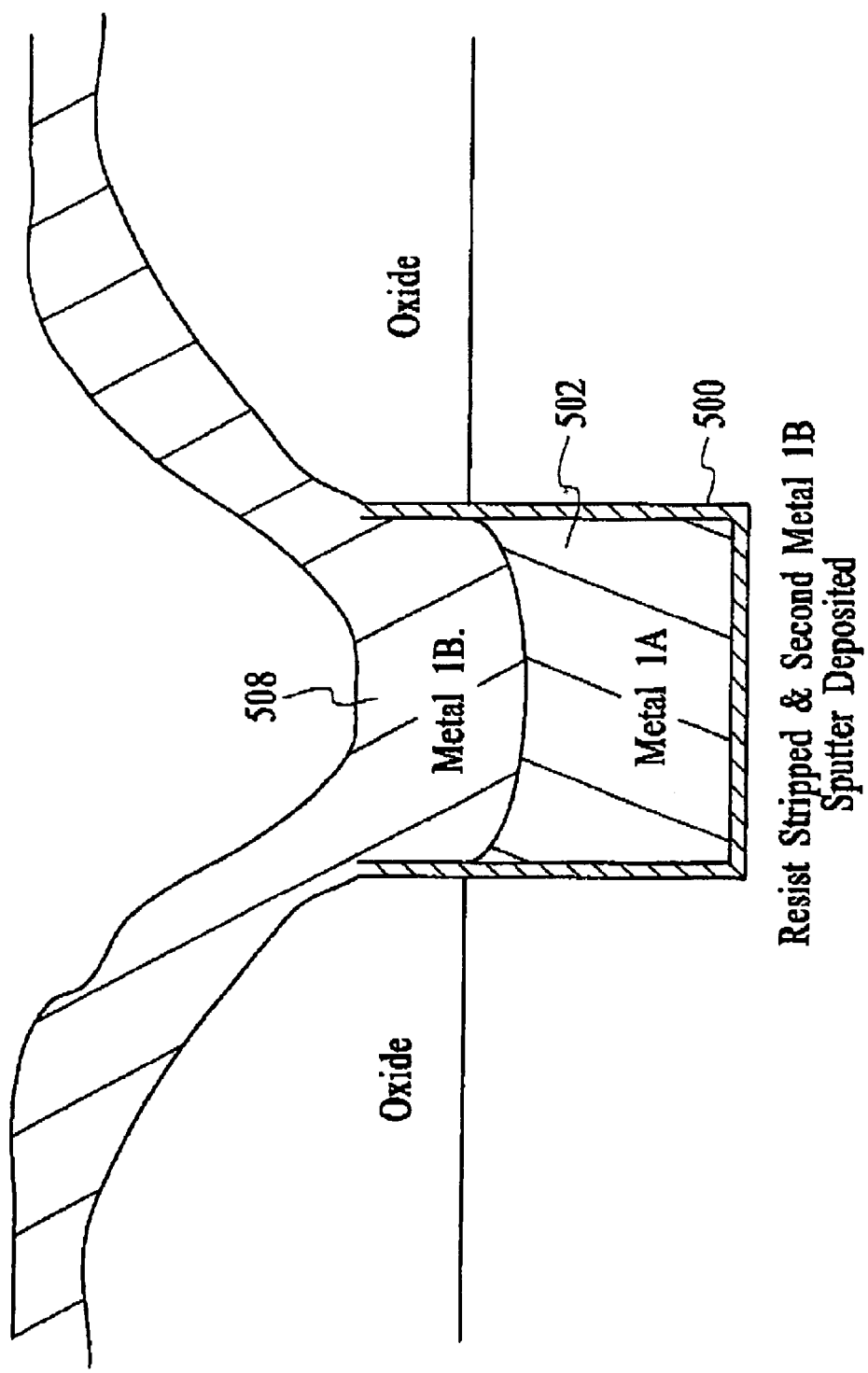
FIG. 8 shows a second deposition of metal as deposited and resist coating the wafer over the second metal and in the field and over the two metal layers in the slots.

FIG. 8 illustrates a second deposition of metal 508, metal applied to the slot 500. The wafers are back sputtered "in situ" to clean the surface prior to sputter deposition of the metal 508. This second deposition of metal 508 receives the same planarizing and stripping of the resist as it was performed on the first deposition of metal 502.

Figure 9:
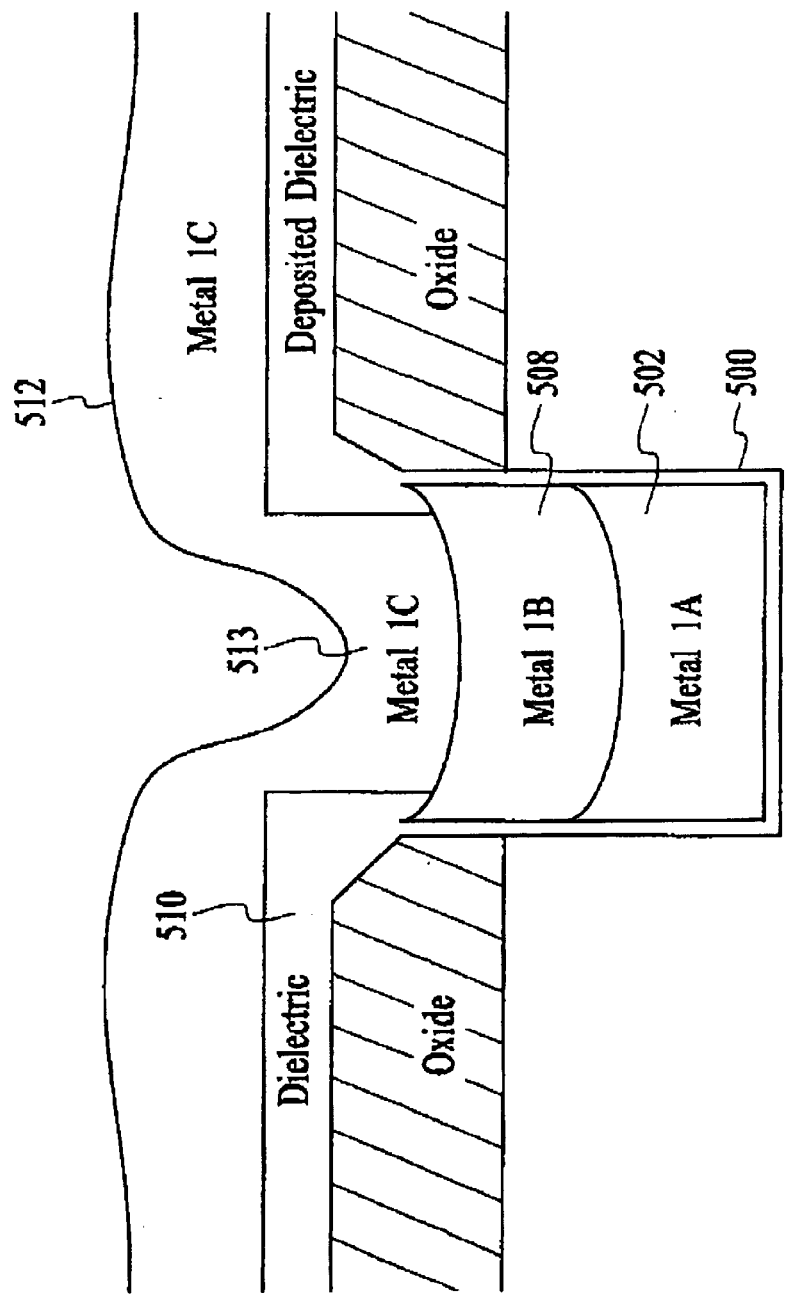
FIG. 9 illustrates two metals and a dielectric deposition followed by contact opening and a third deposition of metal by sputter deposition completing the first metal which is made up of three depositions.

FIG. 9 illustrates three metals after sputter deposition of metal 512. In this case a dielectric 510 is applied to the wafers and covers all the elements prior to deposition of metal 512. Contacts are etched as is normally done prior to standard interconnect metal in the standard process. There are additional contacts to be opened in the slot positions to allow metal to make broad contact to the top of the second deposited metal, which is metal 508. In order to keep the process compatible with the standard process, multiple contacts of the same size as is normally used for the rest of the standard contacts are employed along the length of the metalized slots. This ensures a very low resistance multiple contacting between metal 508 and 512 in the buried slot positions.

The third metal 512 is sputter deposited over via 513 utilizing standard processing for interconnects. The thickness is the same or compatible with the standard metal processing and etching. The third metal 512 forms the interconnect metal as well as being in parallel with first and second metal 502 and 508. This results in thick metal in the slot locations while maintaining a compatible thinner interconnect metal that is consistent with the standard metal process.

The metal thicknesses in this example are 7.5 $\mu$m of metal in the slot locations and 2.5 $\mu$m of metal interconnect and no issue with the edge of the slots. One now has 7.5 $\mu$m of metal in the slots and this is where the main current flow occurs. The only time that current is not flowing in the slots is when a branch of the third metal goes off to provide voltage and power to a low power sections of the circuit. This means that current flow in the 2.5 $\mu$m of metal branching out of the slots is much lower than in the slots.

The main current that is required is to provide power to the power output stage. In this case the buried power buss would go directly into the power node of the output stage and there would not be a branch off of the slot 500. Accordingly, the main power to the output stage is carried directly by 7.5 $\mu$m of metal in this example. This is also the case for the ground straps, the sinker, and special cases throughout the device. Another important consideration is that the slot thick metal is carried out to all the pads where the bonds will be made. This provides several major advantages that the standard processing does not provide. The thicker metal is easier to bond to. When using gold ball bonding, for example, the pressure and temperature of the bonding is determined to a great extent by the thickness of the metal to which it is bonding. The thicker the metal the lower the pressure and temperature of the bonding operation. This provides a reliable plus bonding since tertiary compounds can be formed by this bonding operation if the pressure and temperature is too high resulting in short life times before purple plague and related problems appear. Another advantage is that the input pads are less sensitive to ESD effects that result in damaged metal. In addition the special ESD protection circuits would have an advantage with the thicker metal being utilized.

Oxidation to Shape the Edge

The edge of the slots are slightly rounded as a result of the oxidation that is done after the slots are formed. This oxidation results in rounding of the top edges of the slots due to the oxidation occurring at multiple angles at the edge of the slot. A mild etching to remove the oxide at the edge will result in rounding off the edge sufficient to provide a good entrance for the metal deposition into the slot to meet with the sloped metal already in the slot. This etching normally occurs after the planarization step and prior to stripping the resist left in the slots. If additional slope is required for a given product, this can be accommodated by stripping the slot oxide and re-oxidizing. This double oxidizing provides addition slope to the edges.

Figure 10:
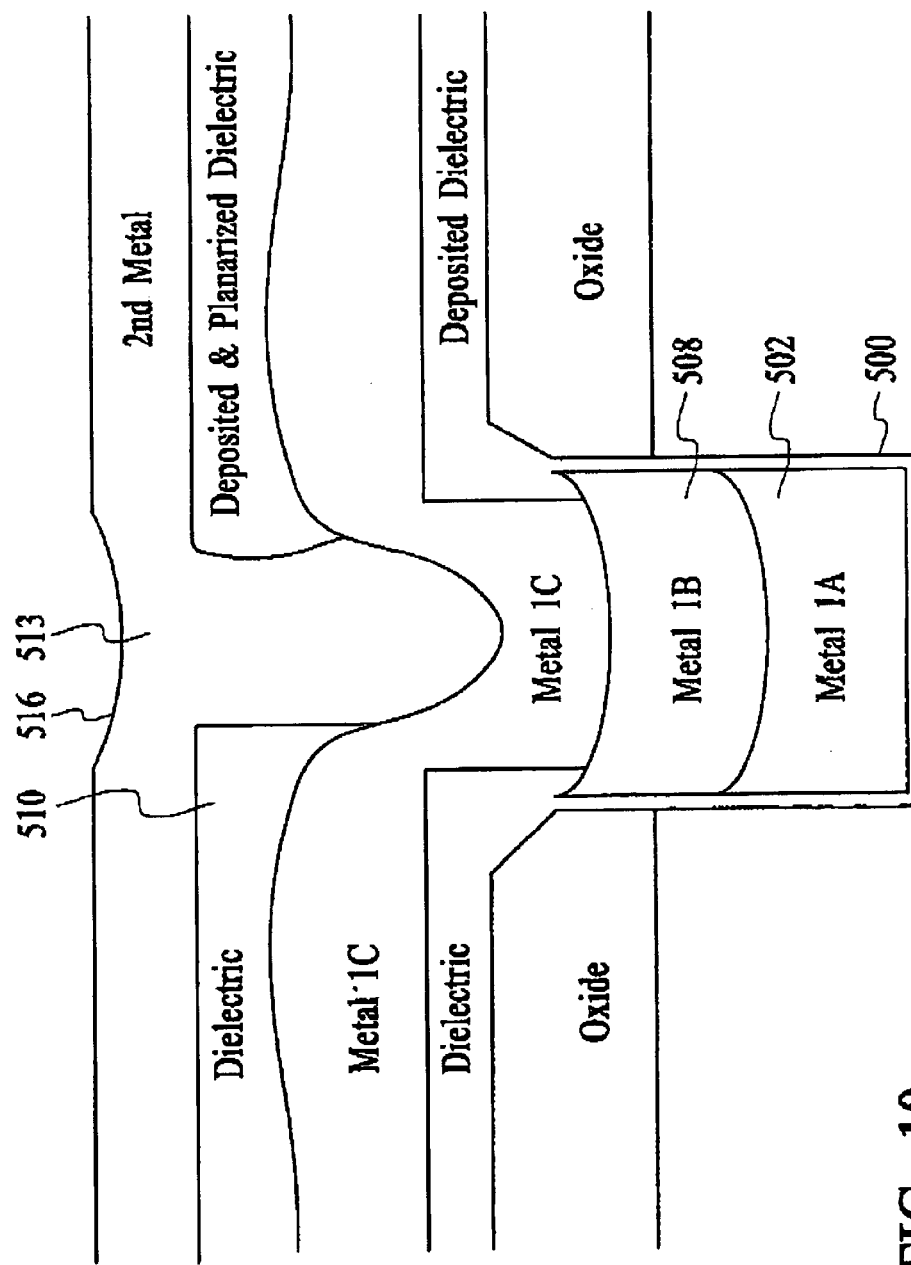
FIG. 10 illustrates a second metal layer after dielectric deposition, via opening and second metal mask planarization and resist stripped.

FIG. 10 illustrates what is classically termed the second metal 516 in standard processing. After dielectric deposition, planarization, via opening and resist stripping, this second metal 516 is deposited over via 513. Where this metal makes contact to any of the slotted busses there will be four layers of metal for carrying heavy current or for dropping the interconnect sheet resistance for high frequency operations. If a classically termed third metal layer is needed to be 5000–8000 um thick to accommodate lower currents or accommodate the etching process, this can be done while maintaining the much thicker metal in the previous layers. To add to the flexibility of this approach, when an additional metal is needed this can be accommodated and allows significant customization using the first three deposited layers that are called the First metal followed by any number of layers. This results in a tremendous ability to carry large current without suffering electromigration or secondary breakdown effects. With the buried power slot approach there is little need for providing the additional metal layers.

Figure 11:
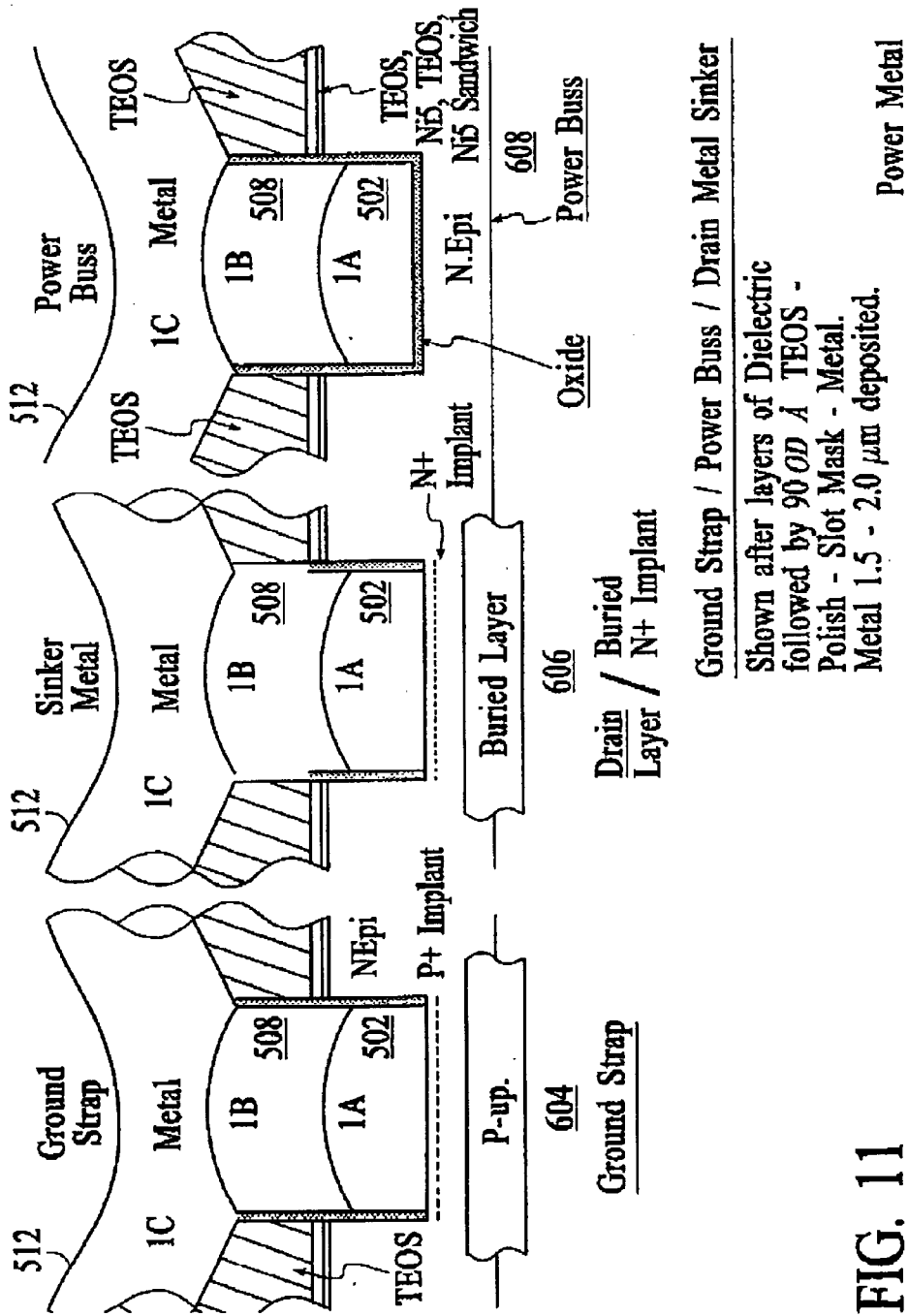
FIG. 11 illustrates an enlarged view of a typical ground strap in the slot to the substrate with oxide removed at the bottom of the slot; a typical sinker (collector/drain) metal in the slot to the buried layer with the oxide removed from the bottom of the slot; and a power buss with the oxide retained at the bottom of the slot. These views are with the three depositions of first metal.

FIG. 11 illustrates an enlarged view of a typical ground strap 604 in a slot 600 to the substrate, a typical sinker 606 (collector/drain) metal in a slot to the buried layer, and a power buss 608 in the slot with the oxide retained at the bottom of the slot. These show applications; where an up diffusion is used to make a ground contact and a buried layer is used to make the collector/drain contact from the sinker power buss to the buried layer for applications where the epitaxial layer is thicker than 6 microns. These illustrate how the first, second and third deposited metal layers make up a "first" metal. The third metal layer 612 makes the normal interconnections plus the contact to the metal layer. Only the third layer thickness is required to be etched for the interconnect metal, while the slots can typically have 3–10 times this metal thickness.

As is seen, the ground strap 604 has low resistance consisting of metal. This metal can be one of several that are commonly used in the standard approaches or the damascene approach. For very deep slots on the order of 15 to 20 microns deep other metals are used that can conform better to this depth of slot. For example, Tungsten could be utilized for this purpose. The ground strap 604 with the oxide "coat" surrounds an epitaxial tub to provide isolation by the oxide. The drain metal sinker 606 is coupled to the buried layer. The power buss 608 is coupled such that the third metal crosses ground from isolated epitaxial tub to adjacent isolated tub with the dielectric layer between the second deposition of metal and the interconnect layer where it passes over the Ground Slot.

A dielectric, previously discussed between the first two metal depositions and the third deposition is provided at these ground strap crossing to prevent the power buss going between tubs from shorting to ground. In this buried power buss approach these first three depositions of metal are referred to as "First Metal" since they provide the function of a normal first metal where the interconnections are patterned. Any subsequent metalization provided with a dielectric between it and this first metal is referred to as "Second Metal".

Figure 12:
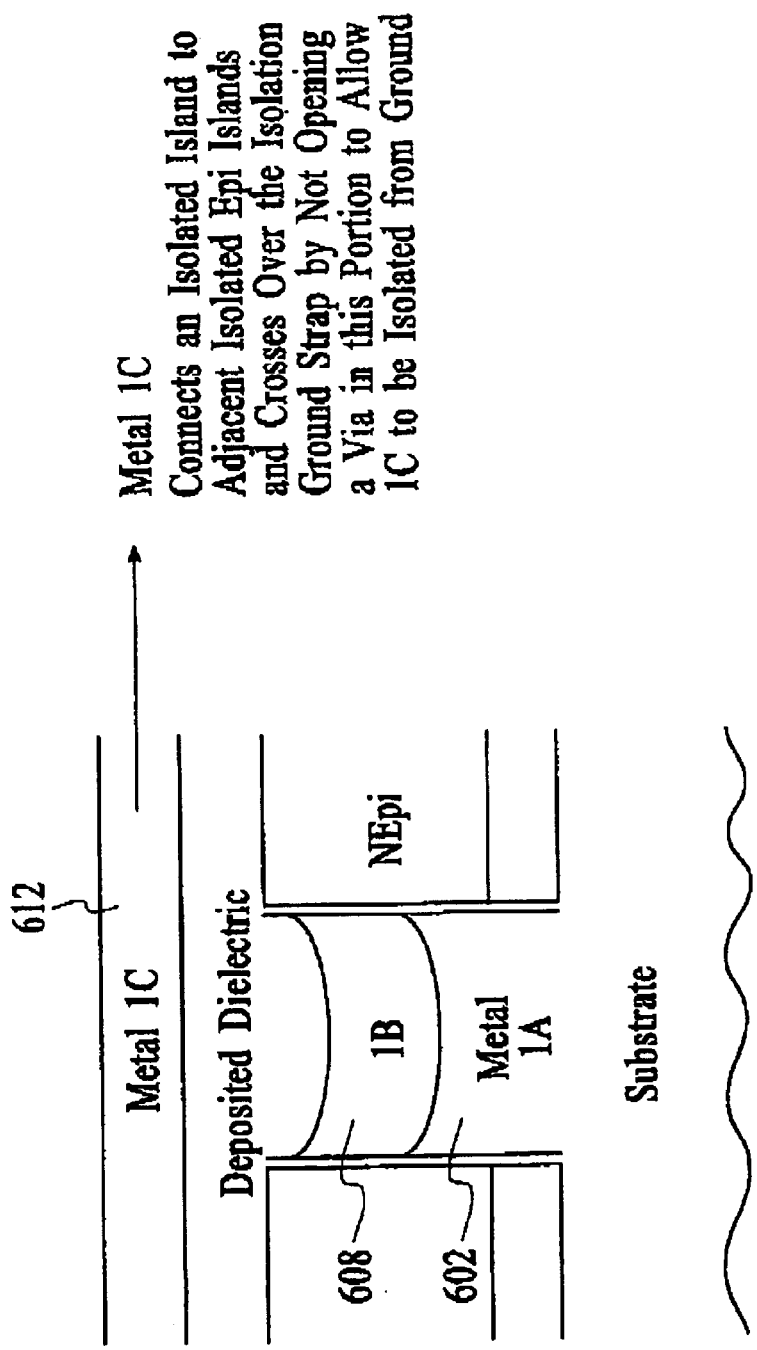
FIG. 12 illustrates a side view of the metal as shown between two adjacent "epitaxial islands" that are isolated by the ground strap.

FIG. 12 shows a typical side view of the metal as shown between two adjacent "epitaxial islands" that are isolated by the ground strap. Where the metal 612 goes from one "island" to the next, the ground strap only contains metal layers 602 and 608 with the deposited dielectric between these metal layers and the metal layer 612. This crossing is the only place the ground strap has two layers of first metal, all other ground straps have the three layers of first metal.

Referring back to FIG. 4a, a typical situation where more than one slot is used to carry the power bus or ground strap is shown. In these cases the slots are separated by approximately 3 μm. In the two slot example, twice the cross section of metal is available for carrying current. As is well known, any number of slots may be utilized for additional cross-section of metals.

CONCLUSION

A method and system for providing an interconnect on a semiconductor device is disclosed. This method, called the buried power buss results in lower interconnect sheet resistance versus standard approaches. The method provides additional capability since it results in oxide isolation in place of junction isolation and allows the long junction isolation process to be eliminated. Oxide isolation results in lower leakage and capacitance than the standard junction isolation. This approach results in the metal having an oxide jacket thus allowing metal to be connected while isolating itself from other circuit functions. The method provides a superior connection from the collector or drain of active devices to the buried layer thus allowing the standard sinker masking and diffusion process to be dropped; while providing a lower Ron (on resistance). The method provides direct contact of the metal grounding to the substrate lowering the Ron of active devices and lowering ground noise. This grounded, oxide isolated buried power bus provides ground isolated epitaxial islands of active and passive elements that need to be circuit isolated from each other. All of these advantages come with reduced masking steps while eliminating long high temperature processes. If the epitaxial layer to be utilized is below a thickness of 6 μm this approach allows for the buried layer masking and diffusion to be dropped from the process providing an additional cost savings.

This method results in interconnect sheet resistance being reduced by a factor of approximately ten (10) compared to the present method utilized by most of the industry. Because of the low sheet resistance of the metal and other steps taken; this approach results in less de-biasing of high current carrying portions of the device, such as the output power device and thus results in higher gain at given voltages or currents. In Bipolar circuits it reduces the Emitter de-biasing that occurs at high current densities in the emitter. Likewise it provides an improved collector operation free from de-biasing.

Heat transfer is one to two orders of magnitude better than damascene and is three orders of magnitude better than what is experienced in methods currently in use. The buried power bus and related interconnect provides at least an order of magnitude better protection against electromigration compared to methods currently in use. The much thicker metal being carried out to the bonding pads results in improved bonding and higher reliability with less sensitivity to ESD effects. Additional benefits include higher current and power dissipation prior to secondary breakdown as compared to standard methods used in the industry. This effect comes about due to the large amount of metal buried throughout the device acting as a built in heat sink.

Since isolation diffusion and sinker are eliminated and isolation is provided by the oxide jacket around the buried power bus, the isolation and sinker can be moved closer to the active area without incurring leakage or breakdown issues. This results in less space being used for the die for a given performance and therefore results in a much smaller die. This results in less loss due to defect densities, which are a function of die area. This combination of smaller die and less losses due to the smaller size results in more gross die per wafer and much more net die per wafer. The smaller die allows products currently produced to be able to fit into smaller packages, thereby opening up new markets for a given function. Direct connection of ground to the silicon substrate as well as heavy metal being utilized throughout the die results in improved heat sinking and allows for the die to be placed in packages where components previously could not operate due to high thermal impedance. Since this approach results in oxide isolation being provided by oxide isolated metal ground straps, higher frequency of operation is realized due to reduced capacitance for a given function. All this capability comes by providing only one slot mask while eliminating several masks and long, high temperature processes.

This approach results in oxide isolation without added steps and allows one to drop the long junction isolation masking and diffusion process. This process drops the normal sinker masking and diffusion process while providing an improved sinker without any additional processing.

In double metal Bipolar devices the top metal is normally the thick metal to carry the power. In order to reduce de-biasing the emitter metal uses the thick second metal to carry the high current to help ensure all emitters light up equally. If the thick metal was also used for the collector it would be difficult to maintain a small critical dimension and an overall small device. This means the collector buss is relegated to a very thin metal of the first metal layer, since it is very difficult to obtain thick first metal due to planarization issues. This means the collector first metal is made wide to reduce the overall resistance (part of "on" resistance). This results in an increase in size resulting in a larger device than one would want. Using the buried power buss approach, both the emitter and collector are provided thick low sheet resistance metal without taking up much area since the metal thickness is provided vertically through the buried power buss slots while maintaining tight critical dimensions.

While this interconnect process provides these major advantages for high power devices, its utilization is applicable for small high frequency devices providing low interconnect resistance, a direct short to the substrate for grounding, and a low Ron (on resistance). This results in a low RC time constant interconnect method. Present high frequency or high pulse rate circuits are being limited in their response due to the RC time constant of the interconnects. Using the buried power buss approach but with much smaller dimensions of slots and metal art; allows this approach to be completely compatible for use in these higher frequency or higher pulse rate circuits while reducing the RC time constant associated with the interconnects. In addition, as the complexity of these high frequency or high pulse rate circuits increases the amount of power also increases. The buried power buss approach provides improved heat transfer for these complex devices allowing for improved margin of operation or further increases in complexity. This approach is applicable to Bipolar, CMOS, BiCMOS, DMOS, and specific devices within these and other technologies.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device comprising:
    a semiconductor substrate, the semiconductor substrate including a plurality of device structures thereon, and a buried layer in the semiconductor substrate; and
    an interconnect on the semiconductor substrate, the interconnect comprising at least one slot provided in the semiconductor substrate and a plurality of metals within the slot wherein the plurality of metals comprises three metals, wherein the first and second metals fill the slot and the third metal provides an interconnect layer, wherein the at least one slot is oxidized everywhere except at the bottom of the slot, and the interconnect forms a sinker to the buried layer.

2. A high voltage interconnect on a semiconductor substrate, the substrate including a buried layer comprising:
    a slot provided in the semiconductor substrate; and
    a plurality of metals within the slot wherein the plurality of metals comprises three metals, wherein the first and second metals fill the slot and the third metal provides an interconnect layer, wherein the at least one slot is oxidized everywhere except at the bottom of the slot, and the interconnect forms a sinker to the buried layer.

3. The interconnect of claim 2 wherein the sinker can be coupled to a collector on a drain of a device to ensure lowest resistance.

4. The interconnect of claim 2 wherein the slot with oxide completely around the three deposited layers is coupled to an emitter of a bipolar device which provides a high current carrying connection to the emitter.

5. The interconnect of claim 2 wherein the slot with oxide completely around the three deposited layers is coupled to a source MOS transistor which provides a high current carrying connection to the source.

6. The interconnect of claim 2 wherein there are a plurality of slots filled with three depositions of metal.

7. The interconnect of claim 6 wherein the plurality of slots are coupled to the emitters, collectors, drains, sources of Bipolar transistors and MOS transistors on the same device, thus forming high current carrying conductors on a same device while limiting the area consumed on the surface to a maximum width of a slot.

8. The interconnect of claim 7 wherein the high current carrying conductors are on the same level of metal resulting in thick metal obtained vertically in the substrate, while limiting the space on the surface of the device and not requiring additional planarization.

* * * * *